US010972106B1

(12) United States Patent
Chou et al.

(10) Patent No.: US 10,972,106 B1
(45) Date of Patent: Apr. 6, 2021

(54) PHASE AND DELAY COMPENSATION CIRCUIT AND METHOD

(71) Applicant: Movellus Circuits Incorporated, Ann Arbor, MI (US)

(72) Inventors: Chun-Ju Chou, Ann Arbor, MI (US); Yuxiang Mu, Ann Arbor, MI (US); Jeffrey Alan Fredenburg, Ann Arbor, MI (US)

(73) Assignee: Movellus Circuits, Inc., Ann Arbor, MI (US)

( * ) Notice: Subject to any disclaimer, the term of this patent is extended or adjusted under 35 U.S.C. 154(b) by 0 days.

(21) Appl. No.: 17/091,572

(22) Filed: Nov. 6, 2020

(51) Int. Cl.
*H03L 7/081* (2006.01)
*H03L 7/091* (2006.01)

(52) U.S. Cl.
CPC .......... *H03L 7/0816* (2013.01); *H03L 7/0814* (2013.01); *H03L 7/0818* (2013.01); *H03L 7/091* (2013.01)

(58) Field of Classification Search
USPC ................... 327/147–149, 156–158
See application file for complete search history.

(56) References Cited

U.S. PATENT DOCUMENTS

| | | | | | |
|---|---|---|---|---|---|
| 5,821,818 | A | * | 10/1998 | Idei | ........................ H03L 7/099 331/17 |
| 6,545,549 | B2 | * | 4/2003 | Swoboda | ............ G06F 11/3636 327/156 |
| 8,675,800 | B2 | * | 3/2014 | Futami | ................ H04L 27/0008 375/376 |
| 10,630,272 | B1 | * | 4/2020 | Ashtiani | ................ H03K 5/133 |
| 2011/0311008 | A1 | * | 12/2011 | Slezak | .................... H03M 9/00 375/353 |
| 2012/0161835 | A1 | * | 6/2012 | David | ..................... H03L 7/146 327/157 |
| 2013/0091392 | A1 | * | 4/2013 | Valliappan | ............ H04L 7/0331 714/700 |
| 2013/0243127 | A1 | * | 9/2013 | Chmelar | ................. H04L 7/033 375/316 |
| 2014/0062549 | A1 | * | 3/2014 | Navid | ....................... H03L 7/14 327/156 |
| 2014/0320181 | A1 | * | 10/2014 | Mitric | ...................... H03L 7/10 327/156 |
| 2017/0250695 | A1 | * | 8/2017 | Lee | ......................... H03L 7/091 |
| 2021/0013888 | A1 | * | 1/2021 | Kim | ........................ H03L 7/095 |
| 2021/0027826 | A1 | * | 1/2021 | Best | ..................... G11C 7/1087 |

* cited by examiner

*Primary Examiner* — Adam D Houston
(74) *Attorney, Agent, or Firm* — Lance Kreisman; Peninsula Patent Group

(57) ABSTRACT

A delay balancing circuit includes a phase detection circuit, a controller, and a delay circuit. The phase detection circuit receives a reference clock signal having a first frequency, and a feedback clock signal derived from an output clock signal. Detection circuitry detects a phase relationship between the reference clock signal and the feedback clock signal. The phase detection circuit generates a detection signal based on the detected phase relationship. The controller operates to sample the detection signal and to generate and pass an update signal to a delay line to update a delay based on the sampled value. The delay circuit receives a third clock signal and applies a delay, based on the update signal, to the third clock signal to generate the output clock signal.

20 Claims, 15 Drawing Sheets

| Delay Code | Delay Cell Row 1 | Delay Cell Row 2 | Delay Cell Row 3 | Delay Unit [UI] |
|---|---|---|---|---|
| 0 | 1 | High Z | High Z | 3 |
| 1 | High Z | 1 | High Z | 5 |
| 2 | High Z | High Z | 1 | 7 |

| Therm Code | Sample Out[0] | Sample Out[1] | Sample Out[2] | Sample Out[3] | Sample Out[4] | Glitch Region |
|---|---|---|---|---|---|---|
| 0 | Early | Late | --- | --- | --- | No |
| 1 | Early | --- | Late | --- | --- | No |
| 2 | --- | Early | --- | Late | --- | Yes |
| 3 | --- | --- | Early | --- | Late | Yes |
| 4 | --- | --- | --- | Early | Late | No |

FIG. 26

| States | ref | fb | E | F |
|---|---|---|---|---|
| Setup | 0 | 0 | 1 | 1 |
| Early | 0 | 1 | 0 | 1 |
| Late | 1 | 0 | 0 | 1 |
| Decision | 1 | 1 | 0 | 0 |

FIG. 27

| State Transitions | early |
|---|---|
| Setup -> Early -> Decision | early -> 1 |
| Setup -> Late -> Decision | early -> 0 |
| Setup -> Early -> Setup | - |
| Decision -> Setup | - |

PHASE AND DELAY COMPENSATION CIRCUIT AND METHOD

TECHNICAL FIELD

The disclosure herein relates to synchronization circuits and methods, and more particularly clock alignment circuits and methods that utilize delay balancing techniques.

BACKGROUND

Synchronization circuits generally synchronize timing between two or more signals. A variety of circuit architectures and methods have been proposed in the art, and generally work well for their intended applications. Improvements in accuracy, latency and power, however, would be desirable.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 26 illustrates a table describing the internal state of the phase detector of FIG. 21.

FIG. 27 illustrates a truth table of the phase detector of FIG. 21.

DETAILED DESCRIPTION

Embodiments of delay balancing circuits and methods are provided. In one embodiment, a delay balancing circuit is disclosed. The delay balancing circuit includes a phase detection circuit, a controller, and a delay circuit. The phase detection circuit receives a reference clock signal having a first frequency, and a feedback clock signal derived from an output clock signal. Detection circuitry detects a phase relationship between the reference clock signal and the feedback clock signal. The phase detection circuit generates a detection signal based on the detected phase relationship. The controller operates to sample the detection signal and to generate and pass an update signal to a delay line to update a delay based on the sampled value. The delay circuit receives a third clock signal and applies a delay, based on the update signal, to the third clock signal to generate the output clock signal.

Figure 1:
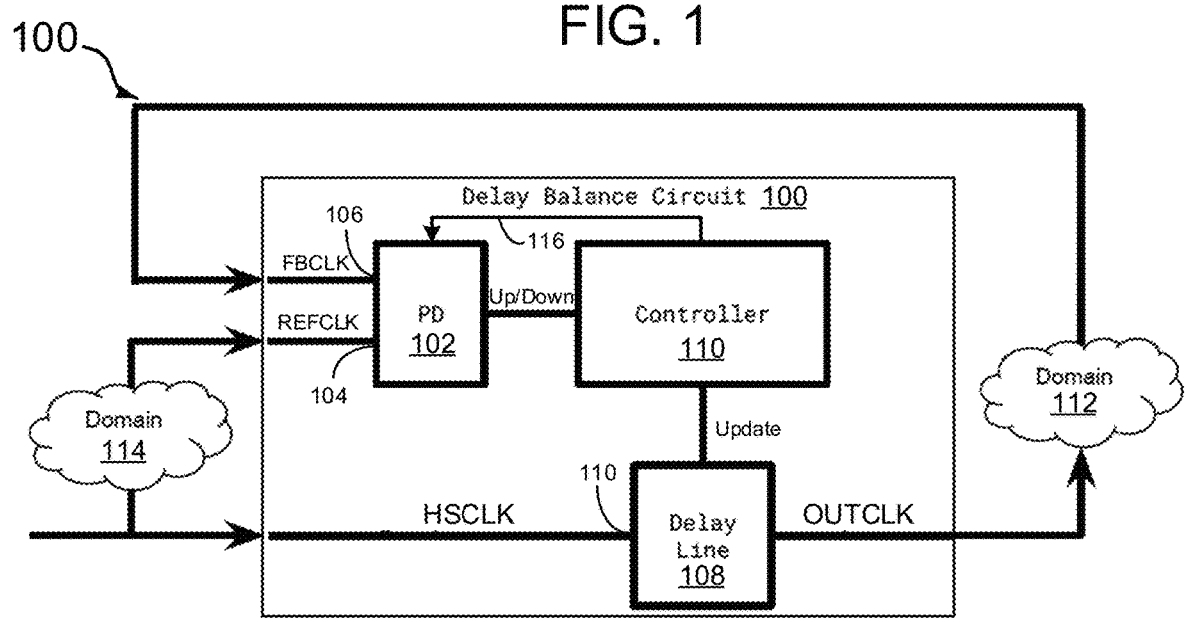
FIG. 1 illustrates one embodiment of a delay balancing circuit employed in a multi-domain application.

FIG. 1 illustrates one embodiment of a delay balancing circuit, generally designated 100, that may be used to phase align multiple clock signals. The delay balancing circuit 100 includes a phase detection circuit 102 having a first input at 104 to receive a reference clock signal REFCLK, and a second input at 106 to receive a feedback clock signal FBCLK. For one embodiment, the feedback clock signal FBCLK is fed back (or derived from) an output of a digitally controlled delay line 108. The digitally controlled delay line 108 includes an input at 110 that receives a high-speed clock signal HSCLK. For one embodiment, the high-speed clock signal HSCLK is a higher frequency harmonic of the reference clock signal REFCLK such that the two clock signals exhibit a coincident edge at a regular timing interval. The digitally controlled delay line 108 delays the high-speed clock signal HSCLK by a delay based on a digital code provided by a controller 110. The delayed output clock signal OUTCLK is thus a delayed version of the high speed clock signal HSCLK. The controller 110 generates the digital code based on a difference in phase between the reference clock signal REFCLK and the feedback clock signal FBCLK. Various embodiments of the phase detection circuit 102, the controller 110, and the digitally controlled delay line 108 are described more fully below.

With continued reference to FIG. 1, for one application, the delay balancing circuit 100 provides a way to close timing between timing signals of a first domain 112, and a second domain 114. The domains may be different clocking structures of different integrated circuit (IC) chips, separate portions of a single IC chip, separate portions of an electronic device or system including an IC chip and a printed circuit board, and so forth. The delay balancing circuit 100 allows for use of its external circuitry to align multiple domains that aren't necessarily co-designed.

For one embodiment, the different domains 112 and 114 may be different voltage domains. The delay balancing circuit can synchronize the reference clock signal REFCLK and the feedback clock signal FBCLK when the signals achieve a locked state. This circuitry provides significant advantages for users that have multiple voltage domains in the system. Apart from this, the delay balancing circuit dynamically tracks the phase position of the reference clock signal REFCLK and the feedback clock signal FBCLK, thus enabling the user to do dynamic voltage and frequency scaling (DVFS). While slowly ramping the voltage and frequency, the relative phase of the feedback clock signal FBCLK to the reference clock signal REFCLK will stay aligned as the system is consistently tracking the difference of the phases.

In one embodiment, additional skew may be applied to the feedback clock signal FBCLK and/or the reference clock signal REFCLK by programming respective input delay circuits (not shown) disposed at the clock signal inputs of the phase detection circuit 102. With this capability, the design can adjust the delay for the output clock signal OUTCLK by a fine offset. For example, programming a higher delay for the reference clock signal REFCLK may lead to an increase in the delay line delay, and vice versa. This delay adjustment will allow the user to move the edge of the feedback clock signal FBCLK relative to the edge of the reference clock signal REFCLK.

In another embodiment, the phase detection circuit 102 may operate in accordance with multiple modes corresponding to, for example, a coarse phase detection mode and a fine phase detection mode that provides for zero-offset phase detection. For such a phase detection circuit, of which one embodiment is described below, a control signal PD_SELECT may be generated by the delay balancing circuit controller 110 and fed back to the phase detection circuit 102 along a control path 116 to set and/or change the modes, depending on whether the delay balancing circuit 100 has reached or is approaching a locked condition.

Figure 2:
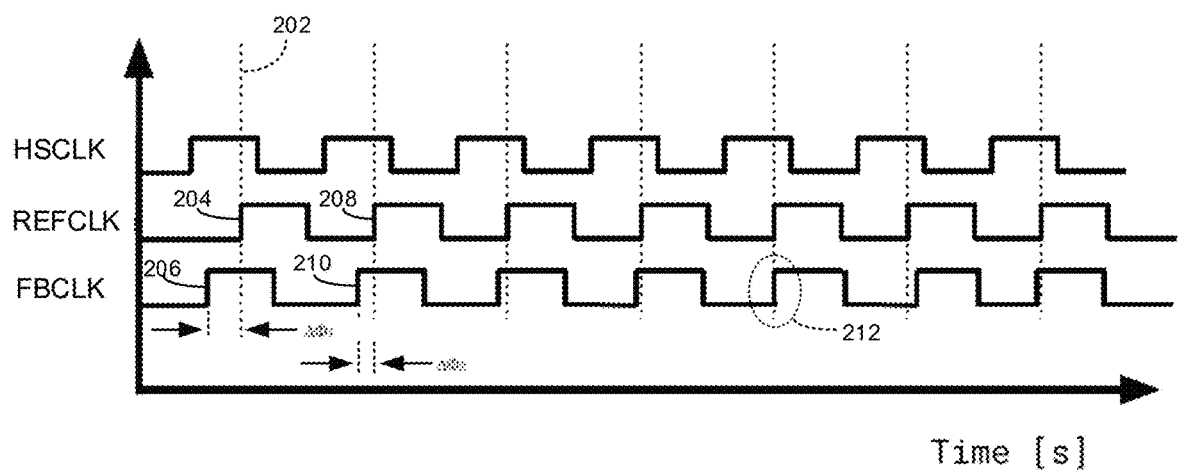
FIG. 2 illustrates timing waveforms involved in operating the delay balancing circuit of FIG. 1.

FIG. 2 illustrates timing signal waveforms showing the high-level operation of the delay balancing circuit 100, with the waveforms superimposed on the same time scale. The topmost waveform represents the high-speed clock signal HSCLK. The middle waveform represents the reference clock signal waveform REFCLK, with each rising edge establishing a phase reference, such as at 202. The bottommost waveform represents the feedback clock signal FBCLK. Beginning with the first reference clock signal rising edge, at 204, the first feedback rising edge, at 206, is phase-offset from the first reference clock signal edge by $\Delta\Phi_1$. This phase offset information is fed to the controller 110 (FIG. 1) to generate a digital code to control the delay line 108 to delay the high speed clock signal HSCLK a delay such that at the next comparison edge of the reference clock signal, at 208, the difference in phase between the next rising edge of the feedback clock signal FBCLK, at 210, and the reference clock signal REFCLK is $\Delta\Phi_2$, which is significantly less than the offset $\Delta\Phi_1$ from the prior clock cycle. The process iterates for every n reference clock cycles until the feedback clock signal FBCLK locks with the reference clock signal REFCLK, at 212.

Figure 3:
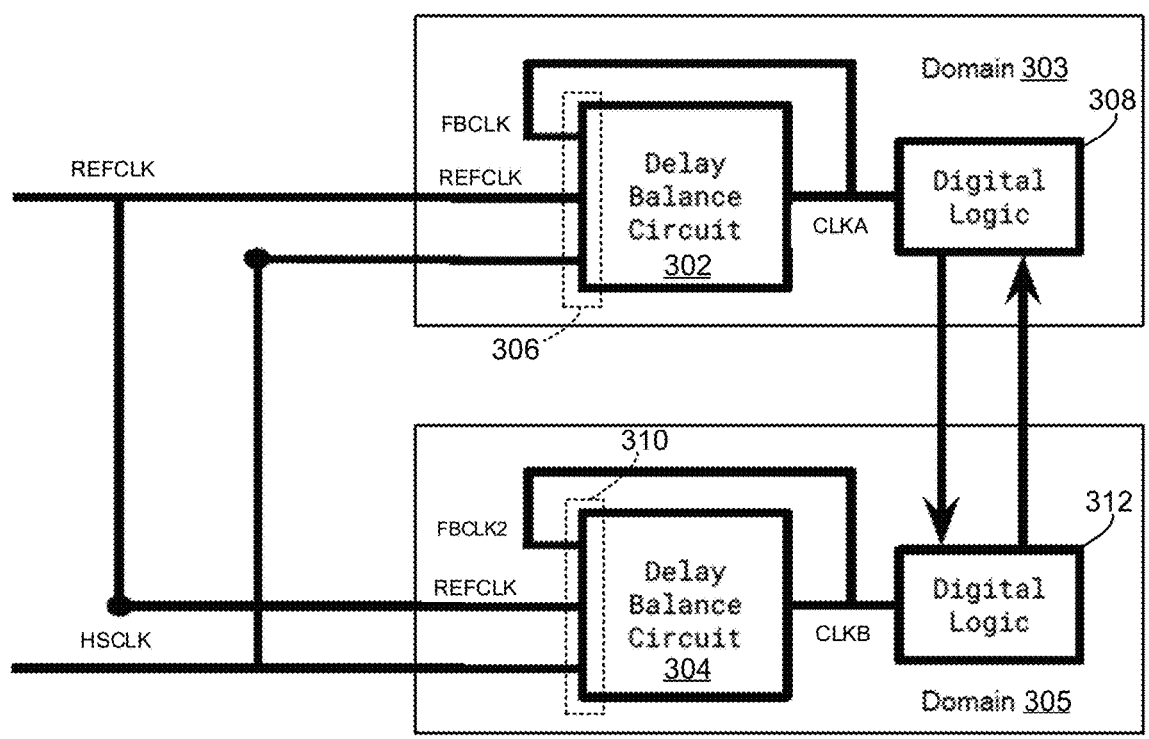
FIG. 3 illustrates a further embodiment of the delay balancing circuit of FIG. 1.

FIG. 3 illustrates an alternative embodiment of a delay balancing system, generally designated 300, utilizing first and second delay balancing circuits 302 and 304 in respective first and second domains 303 and 305 to align a first output clock CLKA in the first domain 303 with a second output clock CLKB in the second domain 305. The first delay balancing circuit 302 is constructed similar to that shown in FIG. 1, with input circuitry 306 to receive a reference clock signal REFCLK, a feedback clock signal FBCLK and a high speed clock signal HSCLK. The output clock signal CLKA of the first delay balancing circuit 302 is a delayed version of the high speed clock signal HSCLK, and is fed back to the input circuit 302 as the feedback clock signal FBCLK. The first output clock signal CLKA is also used as the first clock signal for a first digital logic block 308 operating in the first domain 303. The second delay balancing circuit 304 is constructed similar to the first delay balancing circuit 302, with second input circuitry 310 to receive the same reference clock signal REFCLK, a second feedback clock signal FBCLK2 and the same high speed clock signal HSCLK as used with the first delay balancing circuit 302. The second output clock CLKB of the second delay balancing circuit 304 is a delayed version of the high speed clock signal HSCLK, and is fed back to the input as the second feedback clock signal FBCLK2. The second output clock signal CLKB is also used as the second clock signal for a second digital logic block 312 operating in the second domain 305. With the first and second output clock signals CLKA and CLKB aligned, the first digital logic block 308 is able to synchronously communicate with the second digital logic block 312.

With continued reference to FIG. 3, in some situations, the feedback clock signal FBCLK may be tapped from an output of the digital logic 308 in the first domain 303, such as at 314, while tapped from an output of the second delay balancing circuit 304, of the other domain 305. Other embodiments may tap the outputs of both digital logic blocks 308 and 312 as the respective feedback clock signals FBCLK and FBCLK2. Generally, the delay balancing system 300 of FIG. 3 may be used as a replacement for a traditional clock tree due to the complexities of designing a clock tree architecture capable of taking into account process, voltage and temperature variations into account in a large design. The delay balancing system minimizes the variation that may be introduced by a deep depth tree, thereby enhancing the ability to align the arrival time of both data and clock signals within user-specified timing tolerance, often referred to as "closing timing" between different domains.

Figure 4:
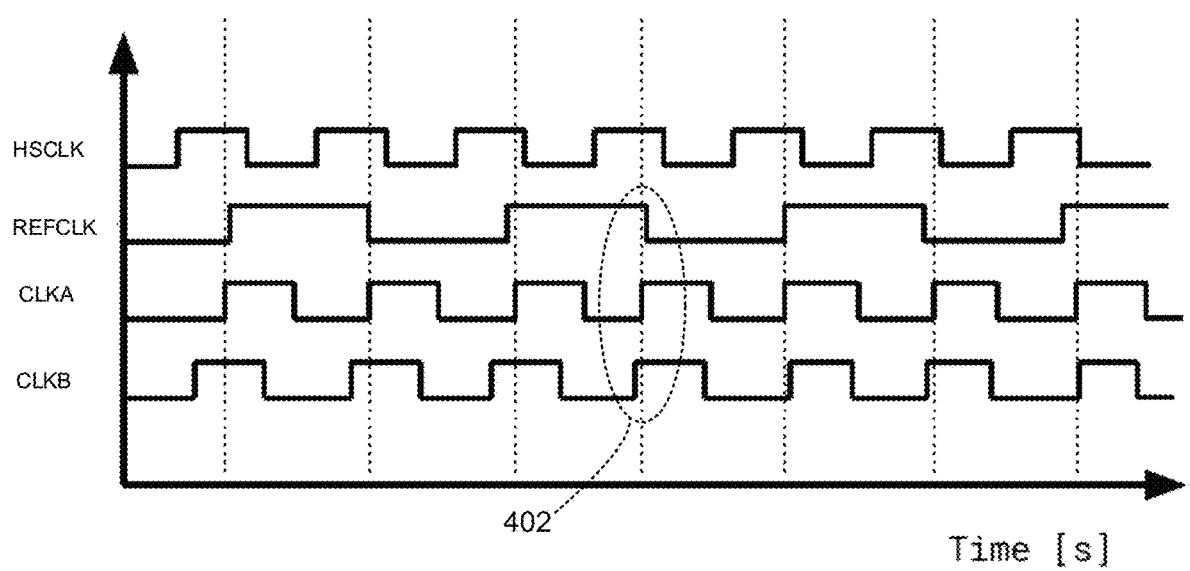
FIG. 4 illustrates timing waveforms involved in operating the delay balancing circuit of FIG. 3.

FIG. 4 illustrates timing waveforms corresponding to the high speed clock signal HSCLK, the reference signal clock REFCLK, and the first and second output clock signals CLKA and CLKB of the first and second domains 303 and 305 during operation of the system of FIG. 3. With the first output clock CLKA serving as the feedback clock signal FBCLK for the first delay balancing circuit 302, and the second output clock CLKB serving as the feedback signal FBCLK2 for the second delay balancing circuit 304, both of the output clock signals CLKA and CLKB are progressively delayed so that they both align and become "locked" to the common reference clock signal REFCLK, at 402, and thus synchronized to each other.

Figure 5:
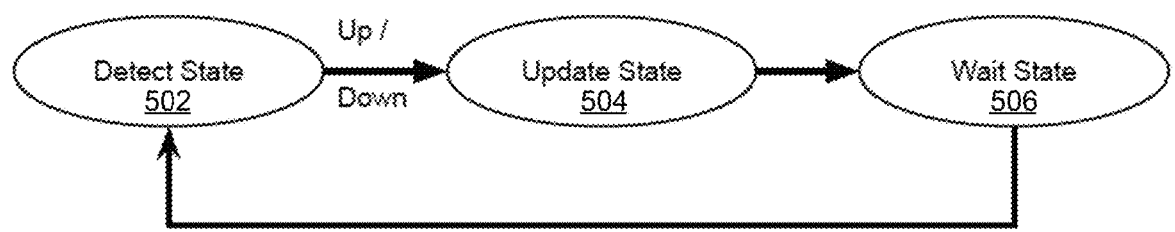
FIG. 5 illustrates a state diagram associated with the operation of the controller employed in the delay balancing circuit of FIG. 1.

FIG. 5 illustrates a state diagram illustrating the delay balancing circuit controller state transitions, according to one embodiment. During operation, the controller 110 orchestrates the operation of the phase balancing circuit 100, alternating between respective detect, update and wait states 502, 504 and 506. During the detect state 502, the controller 110 samples the output of the phase detection circuit 102 and provides the system with an "UP/DOWN" indication as to whether the feedback clock signal FBCLK is leading or lagging the reference clock signal REFCLK.

Figure 6:
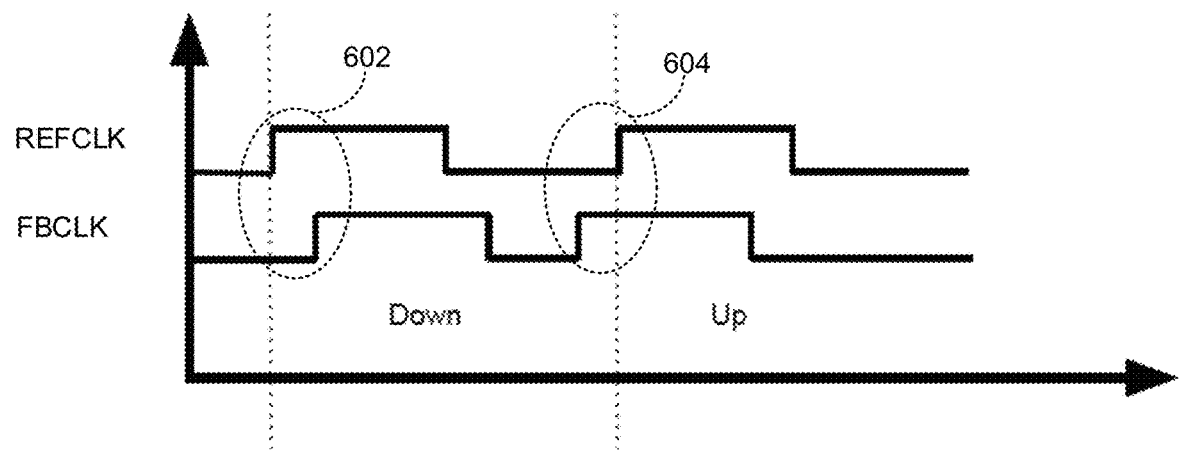
FIG. 6 illustrates waveforms of the reference clock and the feedback clock associated with operation of the controller of FIG. 5.

FIG. 6 illustrates a reference clock signal REFCLK waveform and a feedback clock signal FBCLK waveform to show how an "UP" or "DOWN" signal is triggered. At 602, the feedback clock signal FBCLK is detected as lagging the reference clock signal REFCLK, with the controller 110 generating the "DOWN" control signal to reduce the delay value to the digitally controlled delay line 108, thus pulling back the feedback clock signal FBCLK. At 604, the feedback clock signal FBCLK is detected as leading the reference clock signal REFCLK, with the controller 110 generating the "UP" control signal to increase the delay, thus pushing away the feedback clock signal FBCLK.

Referring back to FIG. 5, in the update state 504, the controller 110 passes the update signal generated during the detect state to the digitally controlled delay line 108, causing the digitally controlled delay line 108 to update its delay based on the sampled phase-detected value. Following the update state 504, the controller goes into the wait state 506.

For some embodiments, the wait state 506 is programmably configured to provide a static, non-dynamic state for the system. The wait state thus provides enough time for the updated delay to propagate back to the feedback clock input of the delay balancing circuit 100. For one embodiment, the controller 110 is programmed to stay in the wait state 506 for "n" cycles, consistent with the relationship:

$$n = (\text{"delay of delay line"} + \text{"delay of output-to-feedback pin"})/\text{clock period}$$

This generally allows the feedback clock signal FBCLK time to propagate through the delay line 108 and come back to the feedback clock input pin of the delay balancing circuit 100. The number of wait states that are used by the system generally corresponds to the bandwidth of the system. In some circumstances, if the round trip delay to the feedback clock input to the delay balancing circuit through the delay line 108 is N periods of the reference clock signal REFCLK, and the delay of the delay line 108 is M periods of the reference clock signal REFCLK, then (N+M) wait cycles may be employed. However, if the round trip delay to the feedback clock input to the delay balancing circuit through the delay line 108 is less than one period of the reference clock signal REFCLK, and the delay of the delay line 108 is M periods of the reference clock signal REFCLK, then only one (1+M) wait cycle need be employed.

Figure 7:
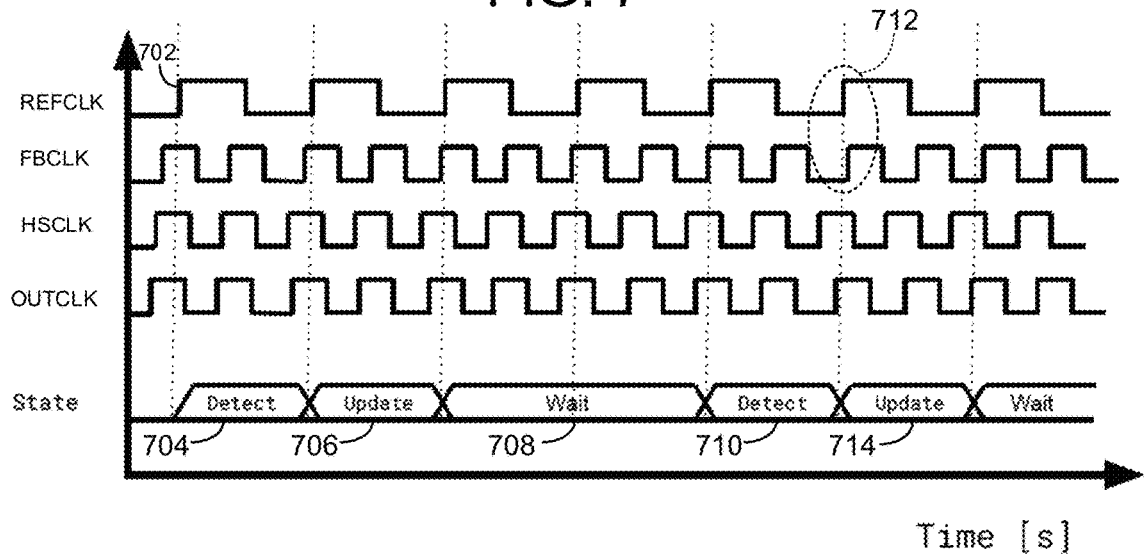
FIG. 7 illustrates further waveforms associated with the state diagram of FIG. 5.

The digitally controlled delay line 108 updates the delay of the system based on the controller's update signal. While the design is locked, the delay line 108 will be toggling between two adjacent delay codes. FIG. 7 illustrates various timing waveforms that show the controller state transitions, and the changes in the waveforms as the state transitions occur. For example, at the rising edge of the reference clock signal, at 702, the controller state will loop from the detect state, at 704, the update state, at 706, the wait state, at 708, and back to the detect state, at 710. When the reference clock signal is lagging, at 712, the output clock signal OUTCLK will be pushed away, at the update state, at 714. The number of cycles of the wait state will depend on the bandwidth of the system.

Figure 8:
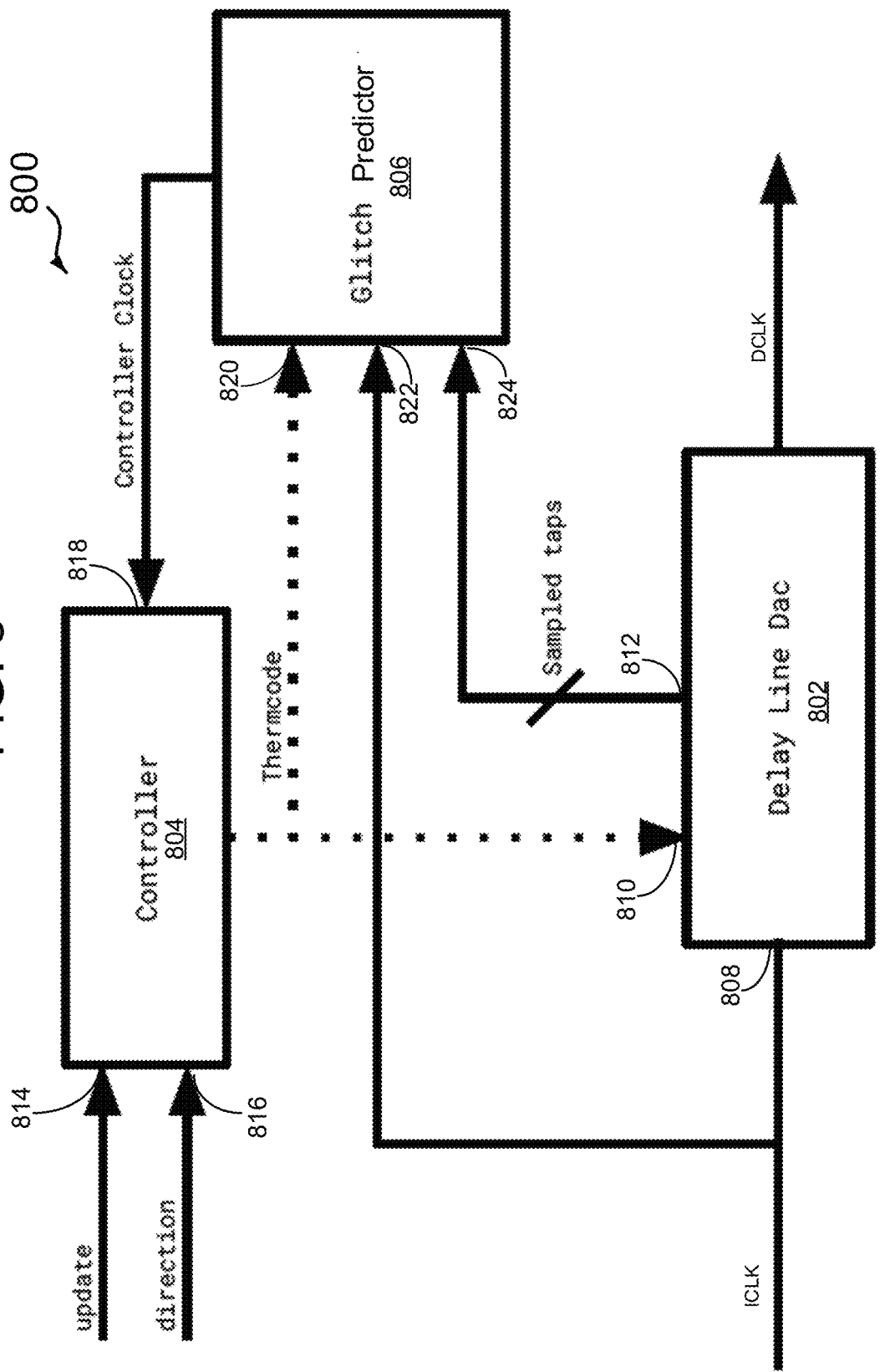
FIG. 8 illustrates one embodiment of the digitally controlled delay line employed in the delay balancing circuit of FIG. 1.

Referring now to FIG. 8, further detail regarding one embodiment of the digitally-controlled delay circuit is shown, generally designated 800. The digitally-controlled delay circuit 800 includes a delay line 802 responsive to a digital code to generate a delay corresponding to the code, a controller 804 to generate the code and orchestrate the operation of the delay circuit, and a glitch predictor 806 to monitor for potential glitch conditions that may arise while changing delay codes. Monitoring for potential glitch conditions, and altering the operation of the delay circuit to account for detected unsafe glitch conditions allows the delay circuit to operate glitch free.

Further referring to FIG. 8, the delay line 802 generally includes a clock input, at 808, to receive an input clock signal ICLK and an output to generate an output clock signal DCLK that is a delayed version of the input clock signal ICLK. A control input, at 810, receives the digital codes from the controller 804. For one embodiment, the digital codes are consistent with thermometer coding techniques, and more fully described below. A sampled tap output, at 812, feeds sampled tap information from the delay line 802 to the glitch predictor 806 to allow for monitoring of potential glitch conditions, more fully explained below.

With continued reference to FIG. 8, the controller 804 dictates which delay elements of the delay line 802 are activated to control the amount of delay applied to the input clock signal ICLK to generate the output clock signal DCLK. The controller 804 includes an update input, at 814, to receive update information from the delay balancing circuit controller 110 (FIG. 1), and a direction input, at 816, to receive a direction signal from the phase detection circuit 102 (FIG. 1), indicating whether the feedback clock signal FBCLK is leading or lagging the reference clock signal REFCLK. A third input to the controller 804, at 818, receives a controller clock CCLK from the glitch predictor 806 that provides the timing signals for the controller 804, such as when to trigger changes to the delay codes, etc.

Further referring to FIG. 8, the glitch predictor 806 includes respective inputs to receive the delay code from the controller 804, at 820, receive the input clock signal ICLK, at 822, and receive the sampled tap information from the delay line 802, at 824. As noted above, the glitch predictor 806 generates an appropriate controller clock signal CCLK to avoid potential glitch conditions that may otherwise arise from changes to the delay codes.

Figure 9:
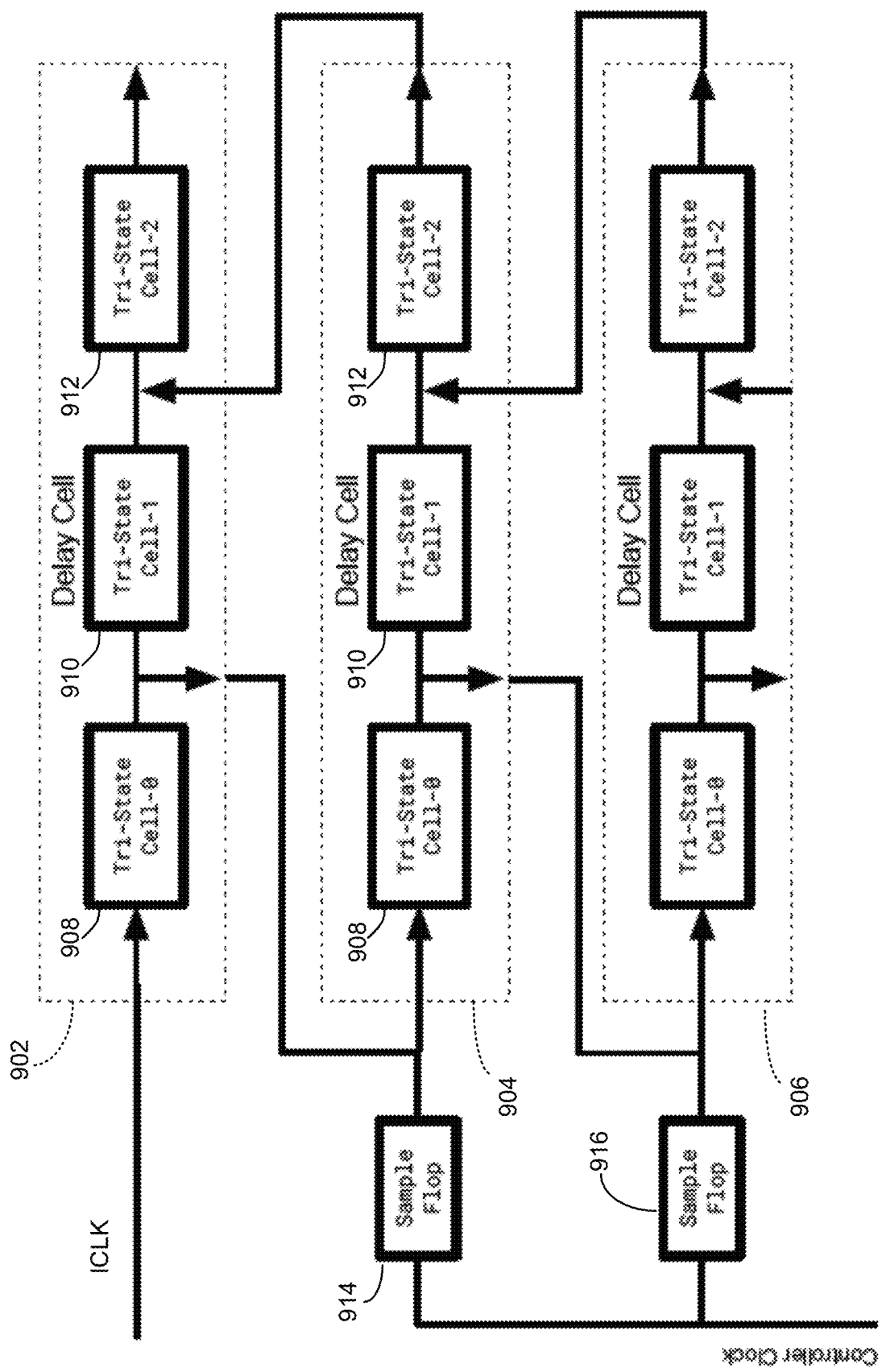
FIG. 9 illustrates one embodiment of a delay line digital-to-analog converter (DAC) employed in the digital delay line of FIG. 8.
Figure 10:
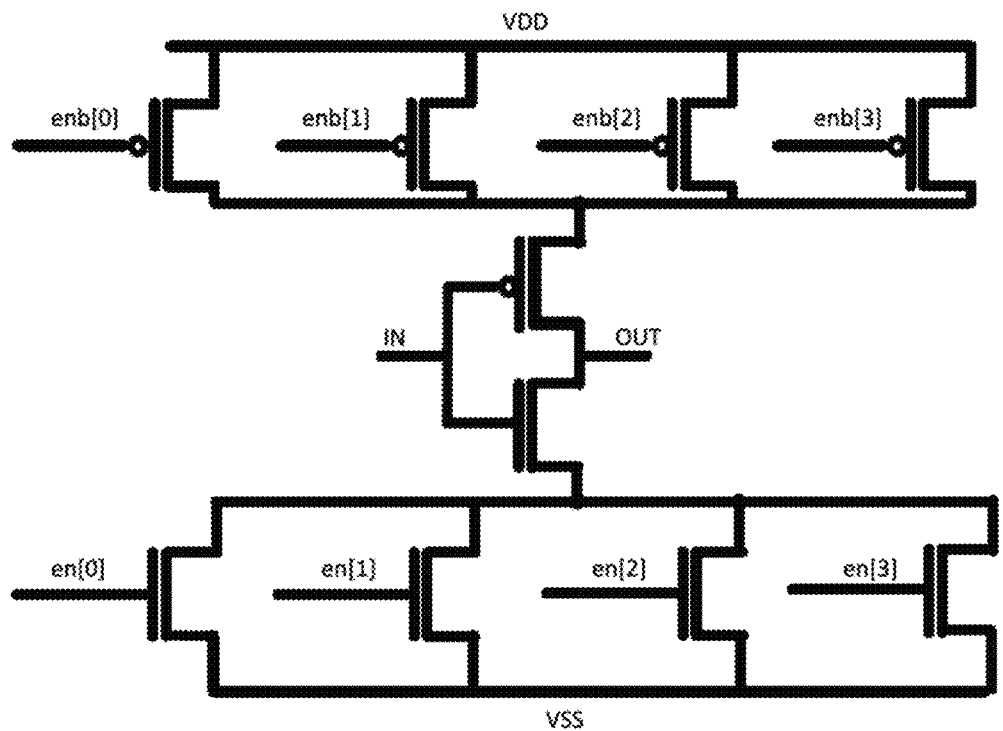
FIG. 10 illustrates one embodiment of a fast tri-state device used in the delay line DAC of FIG. 9.

Referring now to FIG. 9, further detail of one embodiment of the delay line 802 is shown. For this particular embodiment, three identical delay stages are employed, at 902, 904, and 906. Each stage includes three tri-state delay cells, 908, 910 and 912. The first and third delay cells 908 and 912 are of a fast configuration, while the second delay cell 910 of each stage is of a decoupled configuration. FIG. 10 illustrates one embodiment of a CMOS circuit diagram for a representative fast tri-state delay cell (inverter). When the header and footer devices are disabled through the control buses enb and en, the output of the tri-state delay cell, OUT, presents a high-impedance. The high-impedance results from disabling the conduction path between the output, OUT, and the supplies, VDD and VSS. When the header and footer devices are not disabled, the output of the circuit, OUT, is the logical inverse of the input, IN. Changing the number of header and footer devices that are enabled and disabled changes the impedance between the circuit output OUT and the supplies VDD and VSS. When the number of enabled header and footer devices increases, the propagation delay of the circuit decreases since the output, OUT, is able to charge faster. When the number of enabled header and footer devices are decreased, the propagation delay of the circuit increases.

Figure 11:
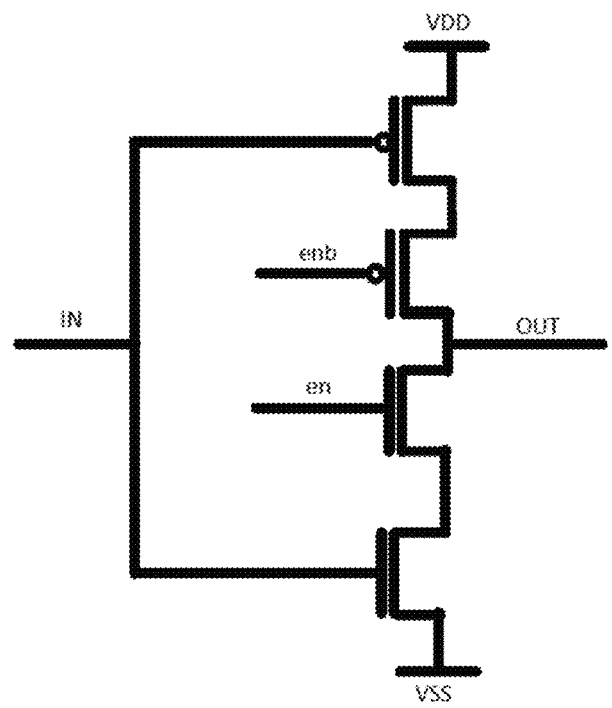
FIG. 11 illustrates one embodiment of a decoupled tri-state device used in the delay line DAC of FIG. 9.

FIG. 11 illustrates one embodiment of a CMOS circuit diagram for a decoupled tristate delay cell (inverter). When the tri-state inverter is enabled through the enable signals en and enb, the output of the circuit, OUT, is the logical inverse of the input, IN. When the CMOS tri-state inverter is disabled through the signals en and enb, the output of the circuit, OUT, presents a high impedance state. When enabled, a strong conduction path exists between the output, OUT, and one of the supply, VSS or VDD, and when disabled, a high impedance path exists between the output, OUT, and the supplies, VSS and VDD, which presents a high impedance at the output, OUT.

With continued reference to FIG. 9, the three identical delay stages 902, 904 and 906 are interconnected to one another such that the output of each first delay cell 908 is fed to an input of the first delay cell of a next stage, and where the output of each third cell 912 (except for the first stage) is fed to the input of the third cell of the preceding stage. Depending on the delay code, the second delay cell 910 for each stage may be disabled/enabled, thus creating a selectable signal routing that incorporates a certain number of the delay cells. The outputs of each of the first cells 908 are also sampled by sampling flip-flops 914 and 916 to provide delay signal information to the glitch detector 806.

Further referring to FIG. 9, a minimum delay setting for the three-stage configuration shown involves having the input clock signal ICLK routed through the first, second and third delay cells 908, 910 and 912 of the first stage 902, for a summed delay total of three unit cell delays. This specified delay would be selectable via generation of a digital code specifying the delay configuration. A next increment of delay would involve disabling the second delay element 910 of the first stage 902, and routing the delay path from the output of the first delay element 908 of the first stage 902, to the input of the first delay element 908 of the second stage 904. The second delay element 910 of the second stage 904 is enabled, so that the delay path goes through to the third delay element 912 of the second stage 904. The output of the third delay element 912 of the second stage 904 is then passed to the input of the third cell 912 of the first stage 902, resulting in a summed delay total of five unit cell delays. Each successive increment of delay follows similarly, with the first stage input to the first cell staying fixed, and the first stage output of the third cell also staying fixed. Having matching path lengths and identical circuitry in the various stages allows for the delay line to be scaled to include more or fewer delay stages while maintaining a very high level of monotonicity and linearity.

Figures 12, 13:
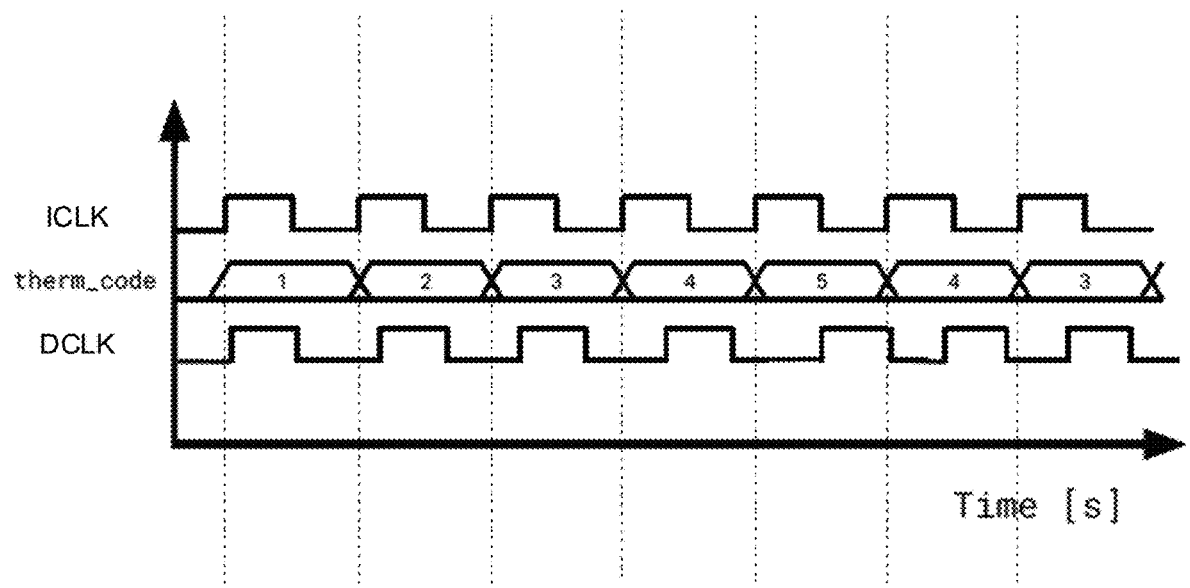
FIG. 12 illustrates a table showing the effect of tri-state cell 1 turning on and off and the corresponding delay at different delay codes.
FIG. 13 illustrates waveforms associated with the operation of the digitally controlled delay line of FIG. 8.

FIG. 12 illustrates a table that shows how each delay code activates a certain stage (row of delay cells), resulting in the number of delay units involved in the delay path.

FIG. 13 illustrates the timing relationship between the input clock signal ICLK and the delayed output clock signal DCLK as various delay codes are applied.

Referring back to FIG. 8, one embodiment of the controller 804 operates in accordance with multiple modes. In a fast mode of operation, such as at start-up, the controller 804 manages a binary search of delay codes in a dynamically changing feedback loop environment in an effort to achieve a phase-locked condition. During the fast mode, the controller clock may often be unusable due to the changing delay codes and resulting output waveforms. However, as the delay balancing circuit achieves a locked condition, the controller 804 enters a slow mode of operation that more finely tunes the change in delay codes to dither about an optimal operating point. To avoid a potential glitch that might occur in the delayed output clock while the delay code changes, the delay line 802 and controller 804 cooperate with the glitch predictor 806.

Figure 14:
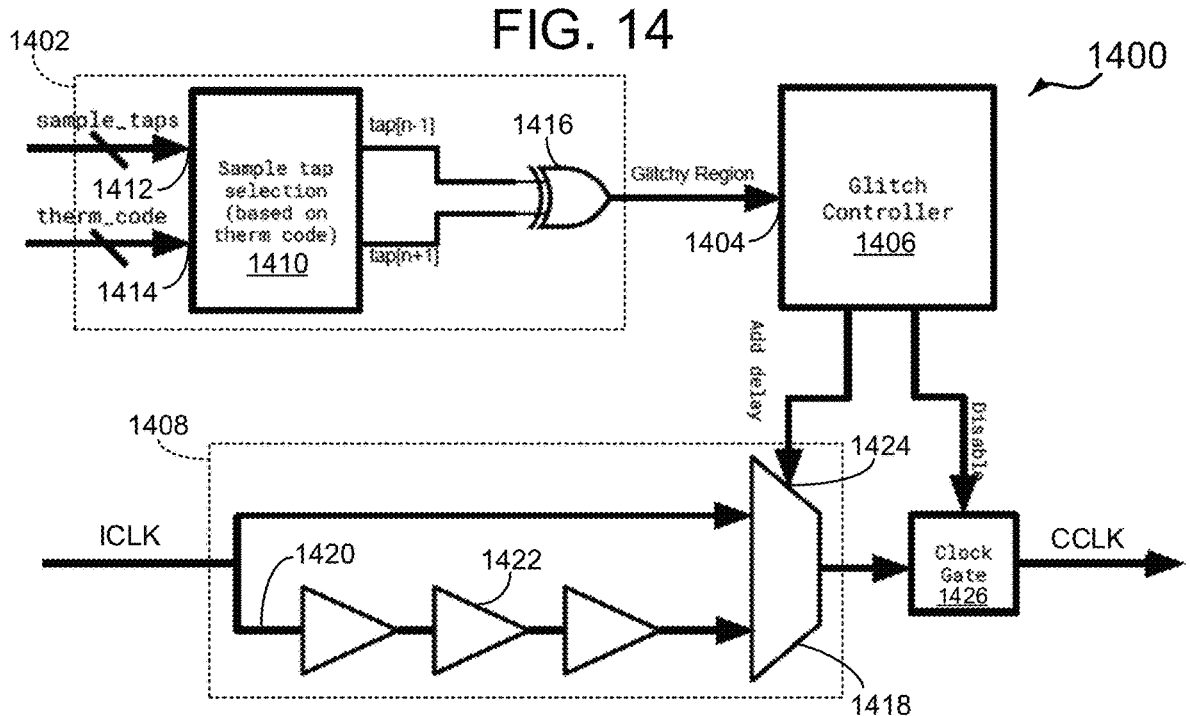
FIG. 14 illustrates one embodiment of the glitch predictor employed in the digitally controlled delay line of FIG. 8.

FIG. 14 illustrates one embodiment for the glitch predictor 806, generally designated 1400. The glitch predictor 1400 employs a first selection circuit 1402 that generates information identifying a time interval defining a glitch-unsafe region. The information is fed to an input 1404 of a glitch controller 1406. The glitch controller 1406 generally monitors for receipt of the glitch information, and conditionally gates or pauses execution of a change in delay of the delay line if the change would occur in the glitch-unsafe region. The glitch controller 1406 carries out the conditional gating through use of a second selection circuit 1408.

Further referring to FIG. 14, the first selection circuit 1402 includes a tap selector 1410 that receives as inputs the sample tap information, at 1412, and the currently applied delay code, at 1414. Based on the delay code, the sample tap selector 1410 selects two sampled tap signals "tap(n−1) and tap(n+1), and feeds the signals to an XOR circuit 1416. The output of the XOR circuit 1416 then provides the XORed information as the indicator of the glitch-unsafe region to the input of the glitch controller 1406.

Figure 15:
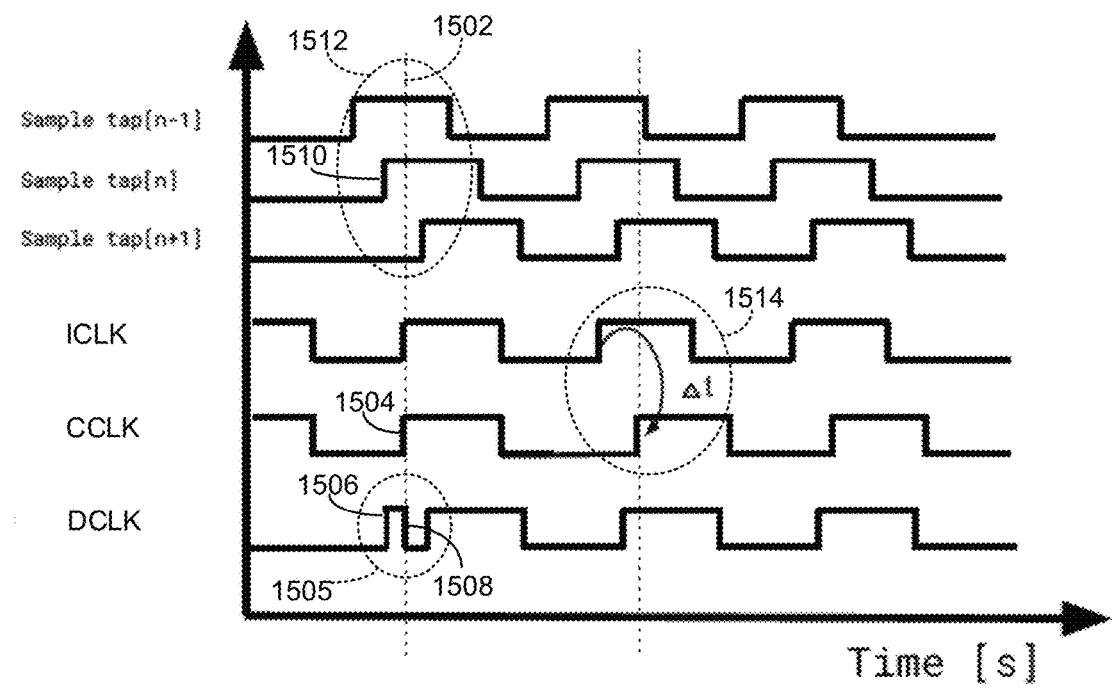
FIG. 15 illustrates a graph showing various waveforms during a delay update, and how a glitch occurs in the absence of the glitch detector of FIG. 14.

FIG. 15 shows how a glitch may affect delay circuits that generate a delayed clock signal as a result of a changing delay code being applied during a glitch-unsafe region. Using the timing instant, at 1502, the controller clock CCLK is shown having a rising edge, at 1504, that samples the sample tap waveforms tap[n−1], tap[n], and tap [n+1]. While updating the delay line from taking the sample tap[n] to tap[n+1], the output clock DCLK will experience a window, at 1505, where it is going from 0 to 1, at 1506, and 1 to 0, at 1508, very quickly because the sample tap[n] has already turned to a value of 1, at 1510, but the target sample tap[n+1] is still at 0. The glitch-unsafe region is thus shown at 1512, where the noted sample values are not all is at the output clock rising edge, at 1504. Utilizing a glitch detector circuit to push the controller clock CCLK away from the glitch-unsafe region, such as by a value of Δt, at 1514, avoids the glitch condition described above.

Referring back to FIG. 14, in order to push the controller clock edge by a delay value, the glitch controller 1406 interfaces with the second selector circuit 1408. The second selector circuit 1408 employs a first signal path with no delay as an input to a multiplexer 1418. A second path 1420 including one or more delay elements 1422 is fed as a second input to the multiplexer 1418. A control signal from the glitch controller 1406 is applied to a multiplexer control input 1424 to select which path to feed through to a clock gate circuit 1426. The clock gate circuit 1426 conditionally passes the input clock from the multiplexer 1418 when receiving a disable signal from the glitch controller 1406. However, when detecting a glitch-unsafe region, and determining that a delay code change will occur in the detected glitch-unsafe region, the glitch controller 1406 issues an enable signal to the clock gate circuit 1426 to pause the output clock (controller clock) from being output to the delay line controller 804 (FIG. 8).

Figures 16, 17:
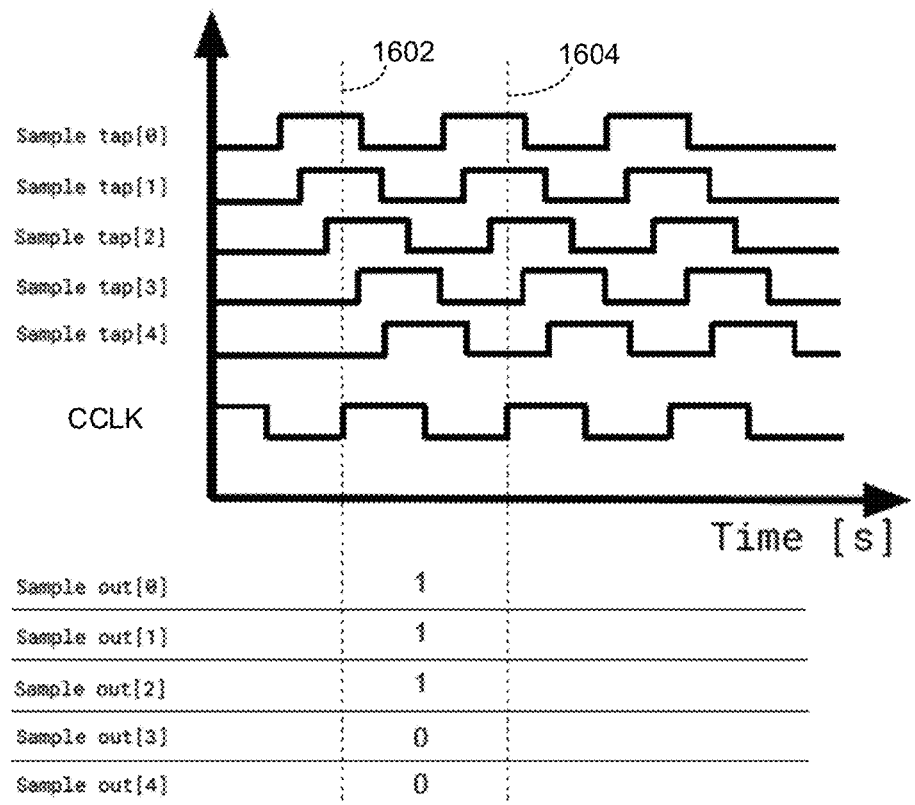
FIG. 16 illustrates a graph showing multiple waveforms associated with the sampled tap information of FIG. 14.
FIG. 17 illustrates a table showing the decoding logic of the glitch predictor.

Further operational details for the glitch detector embodiment of FIG. 14 are shown in FIGS. 16-19. Highlighting how the XORed sampled tap values identify glitch regions, FIG. 16 illustrates sampled tap waveforms for an embodiment of five taps (tap[0], tap[1], tap[2], tap[3], and tap[4]) at time instants 1602 and 1604. With the understanding that only pairs of "every other" sampled tap values are XORed (except for the minimum and maximum delay conditions), and that matching values indicate a non-glitch condition, while non-matching values indicate a glitch-unsafe region, FIG. 17 provides a table for the glitch controller 1406 to use in decoding the interrelationship between the sampled tap values and the delay code (which specifies which delay stages are employed in generating the desired delay).

Further referring to the table of FIG. 17, with a delay code of "0", indicating the minimal delay through three delay cells, the glitch controller 1406 will look at the selected sampled output (early/late) from sample tap[0] and sample tap[1]. The sampled outputs will all be sampled by the controller clock CCLK. The glitch region will only be a "1" if the two selected sample taps have different values. When the delay code is at "1", the selected taps will be sample tap[0] and sample tap[2], or for the code n, the sampled tap values for n−1 and n+1. Note that for the table of FIG. 17, when the delay code is at "2", the selected taps will be tap[1] and tap[3]. This is the code where the glitch predictor will detect a glitch-unsafe region and push the controller clock edge. A similar situation arises for delay codes "3" and "4."

Figure 18:
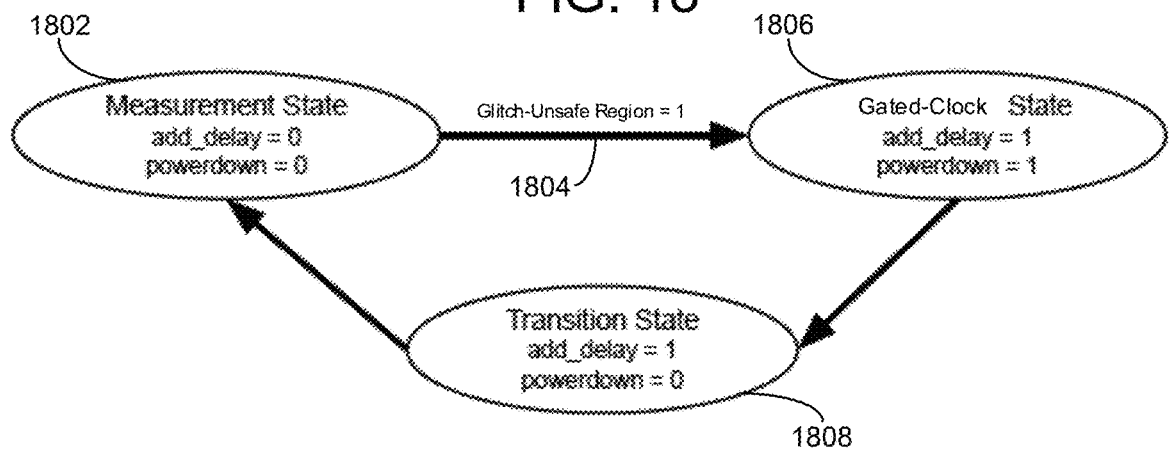
FIG. 18 illustrates one embodiment of a state diagram of the operation of the glitch controller.
Figure 19:
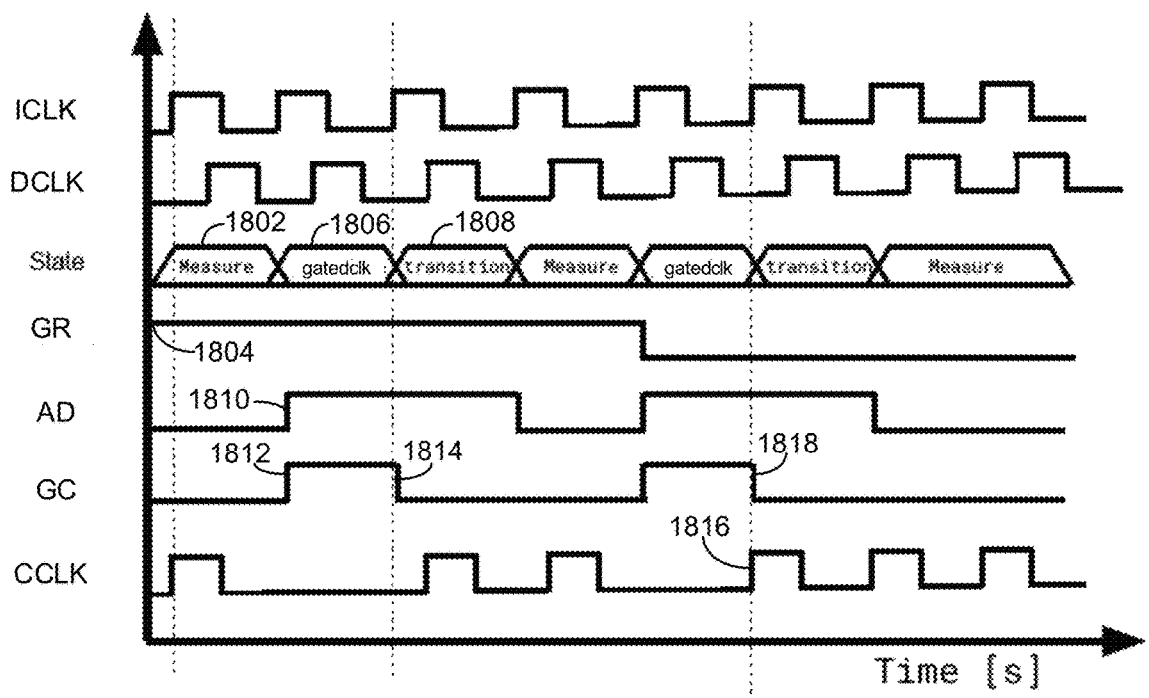
FIG. 19 illustrates various waveforms associated with the state diagram of FIG. 18.

In carrying out its operations, one embodiment of the glitch controller 1406 proceeds in accordance with a progressive series of states, shown in FIG. 18, with associated waveforms shown in FIG. 19. The states are synchronized to the input clock ICLK and result in the generation of control signals indicating (1) a glitch-unsafe region condition with control signal GR, (2) an additional delay to be applied to the controller clock signal CCLK with control signal AD, and (3) a gated-clock control signal GC. In a measurement state, at 1802, the glitch controller 1406 determines if the circuit is operating in a glitch-unsafe region, based on the delay code and the sampled tap values. The glitch controller stays in the measurement state 1802 until a glitch-unsafe region is detected. When a glitch-unsafe region is detected, the glitch-unsafe control signal GR is generated, at 1804, and the controller enters a gated-clock state, at 1806. Entering the gated-clock state 1806 sets the additional delay control signal AD, at 1810, and the gated-clock control signal GC, at 1812, to "1." During the gated-clock state, the controller clock signal CCLK is muted, or gated, so that the delay code cannot change. After a single cycle of the input clock signal ICLK, the gated-clock state is exited, at 1814, and the transition state entered, at 1808. During the transition state, a delay is either added to or subtracted from the input clock ICLK to push the controller clock edge out from the glitch-unsafe region to a non-glitch-unsafe region, such as at 1816, to clock-in the next delay code. The additional delay control signal in the transition state remains at a "1", while the gated-clock control signal goes to "0", at 1818. The measurement state 1802, the gated-clock state 1806, and the transition state 1808 are repeated continually to keep the delay circuit running glitch-free.

Figure 20:
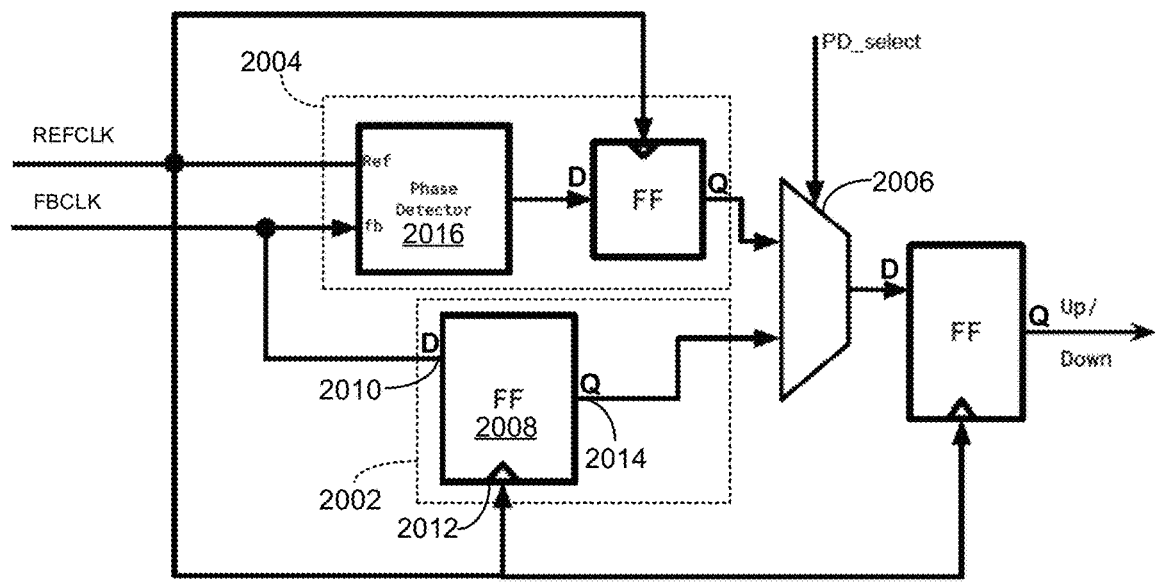
FIG. 20 illustrates a block diagram of one embodiment of a zero-offset phase detector.

Further detail for one embodiment of the phase detection circuit 102 for use in the delay balancing circuit of FIG. 1 is shown in FIG. 20, generally designated 2000. The phase detection circuit 2000 employs circuitry to achieve a zero detection offset when comparing the edges of the feedback clock signal FBCLK and the reference clock signal REFCLK. To carry this out, the phase detection circuit 2000 employs a coarse phase detection path 2002, and a fine phase detection path 2004. A selector 2006 chooses between the paths based on the control signal PD_SELECT, dispatched by the delay balancing circuit controller 110.

Figure 22:
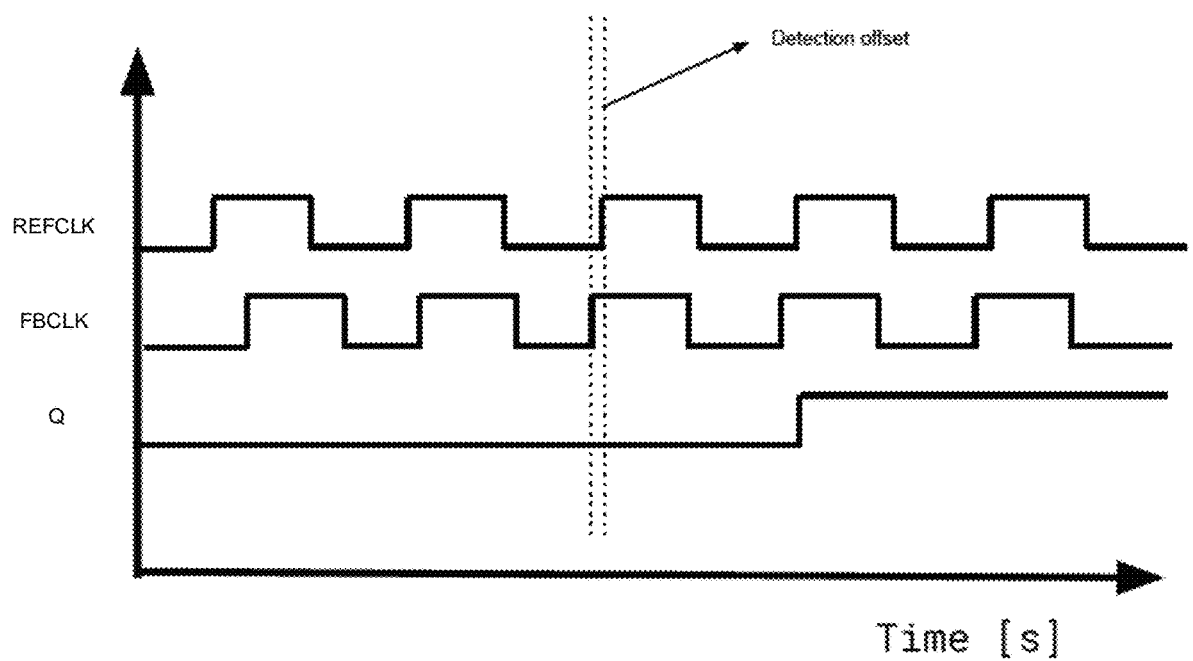
FIG. 22 illustrates waveforms associated with a detection offset in a typical flip-flop based phase detector.

Further referring to FIG. 20, the coarse phase detection path 2002 includes a first flip-flop 2008 that includes a data input, at 2010, to receive the feedback clock signal FBCLK. A clock input, at 2012, receives the reference clock signal REFCLK to clock in the feedback clock signal FBCLK. The flip-flop 2008 includes an output 2014 to generate an output signal "Q" for feeding to one input of the selector 2006. During startup, the coarse phase detection path 2002 adequately generates an early/late signal output that can be used by the delay line to increase or subtract delay to align the reference and feedback clock signals. This is especially the case when the phase difference may be off by 45 degrees or more. However, when the signals are close to phase locking, then the flip-flop based coarse path 2002 becomes prone to instability due to detection offsets caused by variability in the flip-flop setup and hold timing. This problem is illustrated in FIG. 22, where the output waveform Q fails to be triggered even though the reference clock signal REFCLK lags the feedback clock signal FBCLK (and thus the output should be a sampled "1"). The failure in triggering is due to the setup/hold timing variability in the flip-flop internal circuitry.

Figure 21:
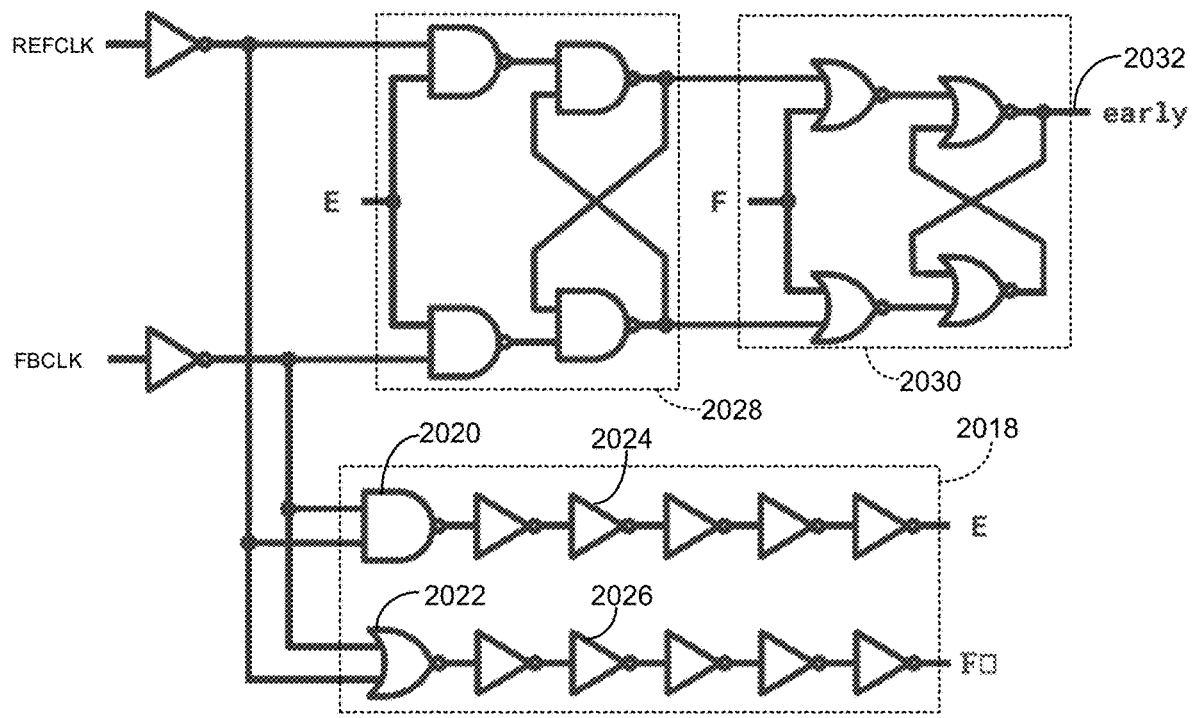
FIG. 21 illustrates one embodiment of a circuit diagram of the phase detector of FIG. 20.

In an effort to avoid the detection offset inherent in flip-flop phase detection circuits, one embodiment of the fine tuning phase detection path 2004 employs a phase detector 2016 that employs symmetrically-matched asynchronous logic that incurs no delay when detecting the states of the reference and feedback clock signals. FIG. 21 shows a specific embodiment of the phase detector 2016. The phase detector 2016 includes a detection path 2018 that includes a NAND gate 2020 and NOR gate 2022 to each receive the reference clock signal REFCLK and the feedback clock signal FBCLK as inputs. Respective lines of inverter elements 2024 and 2026 are disposed at the outputs of the NAND and NOR gates 2020 and 2022 to generate respective signal states "E" and "F." The "E" state is fed to a first stage 2028 (master) of a symmetric cross-coupled NAND-based latch that feeds a second stage 2030 (minion) made up of a symmetric cross-coupled NOR-based latch. The "F" state is fed as an input to the NOR-based latch. The resulting output, at 2032, indicates whether the reference clock signal REFCLK leads (early) or lags (late) with respect to the feedback clock signal FBCLK. For some embodiments, the symmetric circuitry comprises differential circuitry.

Figure 23:
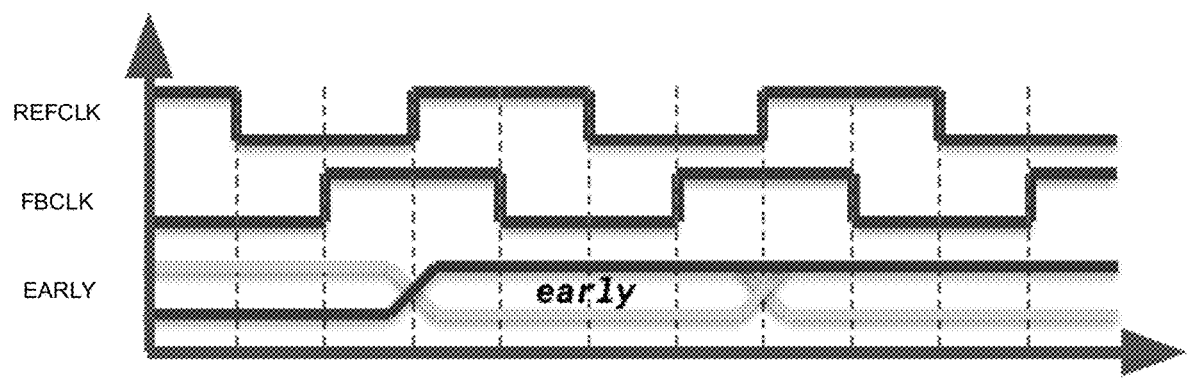
FIG. 23 illustrates waveforms associated with the phase detector when the reference signal is lagging the feedback signal.
Figure 24:
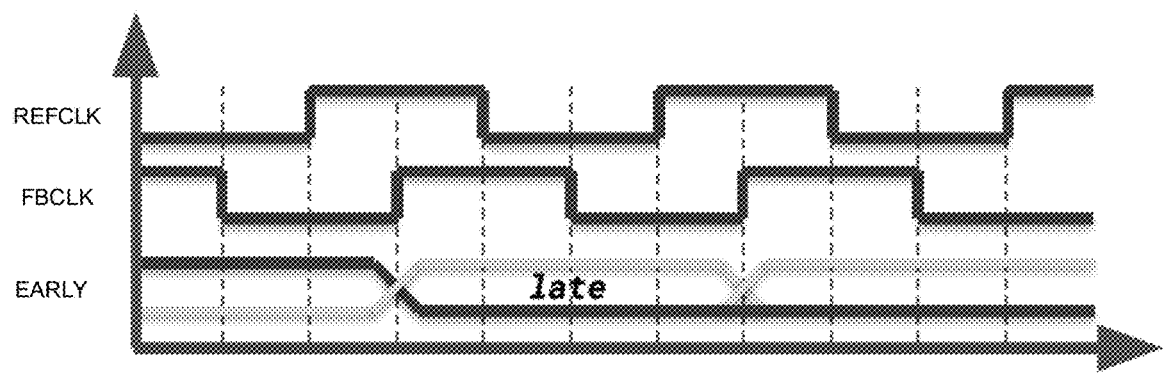
FIG. 24 illustrates waveforms associated with the phase detector when the reference signal is leading the feedback signal.

FIGS. 23 and 24 illustrate the basic timing involved between the reference clock and the feedback clock, a resulting "early" output (FIG. 23) and a resulting "late" output (FIG. 24).

Figure 25:
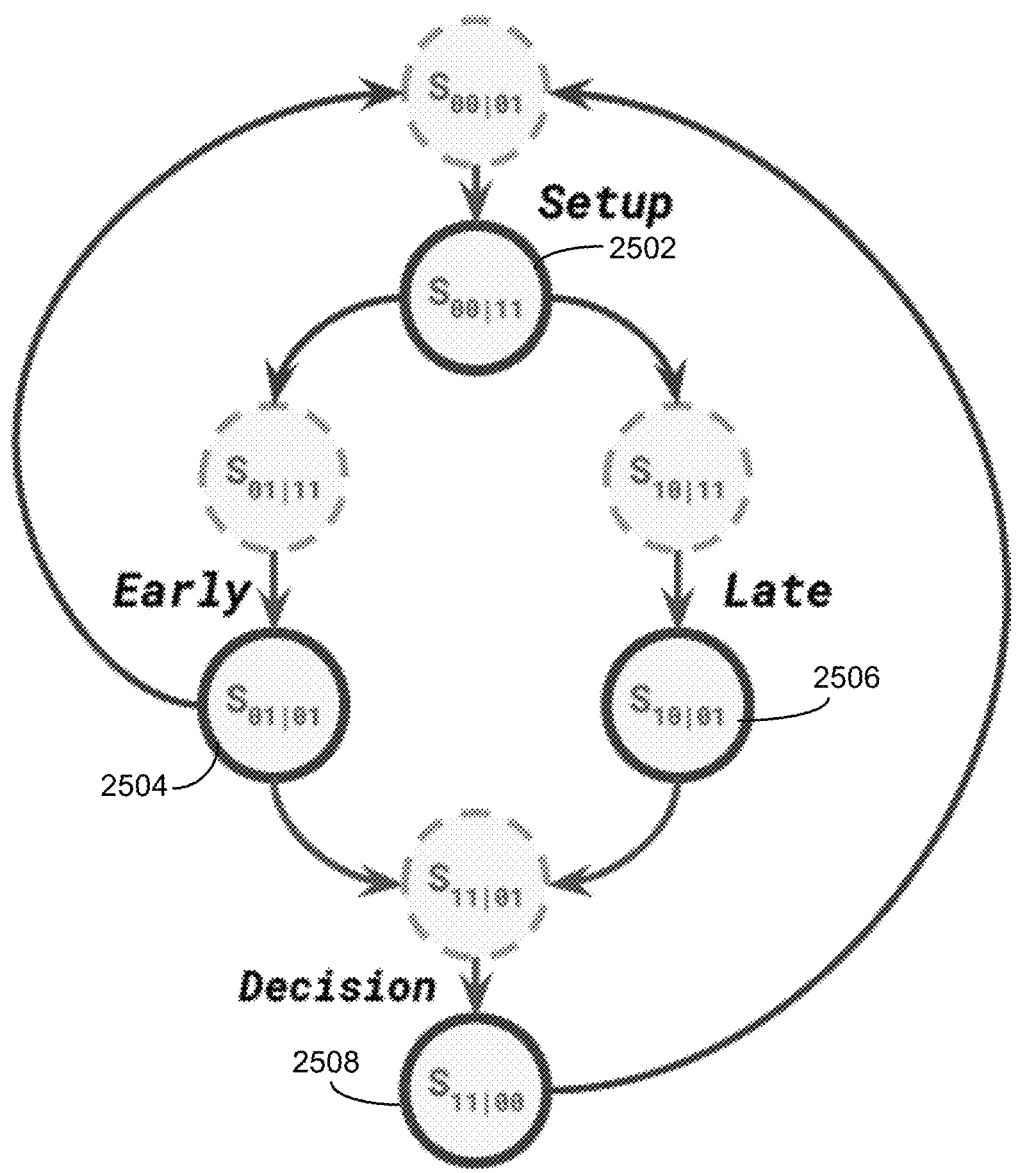
FIG. 25 illustrates a state diagram of the operation of the phase detector of FIG. 20.

Operation of the phase detector 2016 is shown by the state diagram of FIG. 25, and corresponding state tables illustrated in FIGS. 26 and 27. Referring now to FIG. 25, states are shown as $S_{XY/WZ}$, where X, Y, W, Z represent the reference clock signal REFCLK, feedback clock signal FBCLK, and the E and F signal values. States enclosed by dashed lines represent transitioning states. The state diagram also assumes that the reference clock frequency is not faster than the feedback clock frequency.

With continuing reference to FIG. 25, operation first begins at a setup state, at 2502, where both the reference clock signal REFCLK and the feedback clock signal FBCLK are at "0." This allows the phase detector 2016 to properly detect the phase difference when the reference clock signal REFCLK and the feedback clock signal FBCLK are at different frequencies. When the feedback clock signal FBCLK transitions from 0 to 1, and the reference clock stays at 0, the output will go to an early state, at 2504, indicating that the reference clock is lagging. In contrast, if the reference clock transitions from 0 to 1, and the feedback clock stays at 0, then the phase detector 2016 will go into a late state, at 2506, indicating the reference clock is leading. Whenever a decision is made during a decision state 2508, the phase detector 2016 can only go back to the setup state 2502 when both the reference clock and feedback clock are at 0.

The internal state of the phase detector 2016 is shown in the table of FIG. 26. During the setup state 2502, both the master latch 2028 and the minion latch 2030 will be enabled, so E and F are both set to 1. During the early and late states, the master latch 2028 will be disabled, and the minion latch 2030 will continue to store the state. In the decision state 2508, both latches will be shut down waiting for the next setup state to come. FIG. 27 illustrates a truth table associated with operation of the phase detector 2016. The table also shows the state transition of the phase detector 2016. New decisions can only be made after it goes back to its setup state 2502, and the output will only make transitions during the decision state 2508.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be symmetric or differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A delay balancing circuit, comprising:
   a phase detection circuit including
     a first input to receive a reference clock signal having a first frequency, and a second input to receive a feedback clock signal, the feedback clock signal derived from an output clock signal;
     detection circuitry to detect a phase relationship between a first edge of the reference clock signal and a second edge of the feedback clock signal; and
     an output to generate a detection signal based on the detected phase relationship;
   a controller operative to sample the detection signal to obtain a sampled value and to generate and pass an update signal based on the sampled value; and
   a delay circuit including
     a third input to receive a third clock signal having a second frequency that is a harmonic of the first frequency; and
     a delay line to apply a delay to the third clock signal to generate the output clock signal, the delay based on the update signal.

2. The delay balancing circuit of claim 1, wherein the output clock signal is fed back to the phase detection circuit as the feedback clock signal.

3. The delay balancing circuit of claim 1, wherein the phase detection circuit is configured to detect the phase relationship based on whether the second edge leads or lags the first edge.

4. The delay balancing circuit of claim 3, wherein the phase detection circuit further comprises:
   a phase detector including symmetric asynchronous logic to exhibit a zero detection offset value when detecting the phase relationship.

5. The delay balancing circuit of claim 1, wherein:
   the controller is configured to operate in multiple states, wherein
     during a detection state, the controller is operative to sample the detection signal to generate a sampled value;
     during an update state, the controller is operative to generate and pass the update signal based on the sampled value; and
     during a wait state, the controller is operative to maintain static operation during a configurable time interval.

6. The delay balancing circuit of claim 5, wherein:
   the configurable time interval for the wait state is set by a user.

7. The delay balancing circuit of claim 6, wherein:
the duration of the configurable time interval is a value corresponding to a propagation delay from the output of the delay circuit to the input of the phase detection circuit.

8. The delay balancing circuit of claim 1, further comprising:
programmable delay circuitry disposed at the input of the phase detection circuit to programmably delay one or both of the reference clock signal and the feedback clock signal.

9. The delay balancing circuit of claim 1, wherein:
the reference clock signal is generated in a first domain, and the feedback clock signal is generated in a second domain that is different from the first domain.

10. A method of balancing delays in a circuit, the method comprising:
receiving a reference clock signal having a first frequency, and a feedback clock signal, the feedback clock signal derived from an output clock signal;
detecting a phase relationship between a first edge of the reference clock signal and a second edge of the feedback clock signal;
generating a detection signal based on the detected phase relationship;
sampling the detection signal;
generating and passing an update signal based on the sampled value;
receiving a third clock signal having a second frequency that is a harmonic of the first frequency; and
applying a delay to the third clock signal to generate the output clock signal, the delay based on the update signal.

11. The method according to claim 10, wherein:
detecting the phase relationship is based on whether the second edge leads or lags the first edge.

12. The method according to claim 10, wherein:
the sampling of the detection signal occurs during a detection state;
the generating and passing of the update signal is based on the sampled value during an update state; and
wherein the method further comprises
maintaining static operation during a configurable time interval during a wait state;
wherein the duration of the configurable time interval is programmed to a value corresponding to a propagation delay from an output of a delay circuit that applies the delay, to an input that receives the feedback clock signal.

13. The method according to claim 10, further comprising:
programmably delaying one or both of the reference clock signal and the feedback clock signal.

14. The method of claim 10, wherein:
the reference clock signal and the third clock signal are received in a first domain; and
the output clock signal is generated in a second domain.

15. A delay balancing system, comprising:
a first delay balancing circuit operating in a first domain, the first delay balancing circuit including first input circuitry to receive a reference clock signal, a feedback clock signal, and a third clock signal that is a harmonic of the reference clock signal, the first delay balancing circuit to generate a first output clock signal that is a first delayed version of the third clock signal;
a first logic block clocked by the first output clock signal;
a second delay balancing circuit operating in a second domain, the second delay balancing circuit including second input circuitry to receive the reference clock signal, a second feedback clock signal, and the third clock signal, the second delay balancing circuit to generate a second output clock signal that is a second delayed version of the third clock signal;
a second logic block clocked by the second output clock signal; and
wherein the first delay balancing circuit and the second delay balancing circuit cooperate to align first edges of the first output clock signal with second edges of the second output clock signal.

16. The delay balancing system of claim 15, further comprising:
a communication path between the first logic block and the second logic block.

17. The delay balancing system of claim 15, wherein:
the first feedback clock signal comprises one of the first output clock signal and an output of the first logic block derived from the first output clock signal; and
the second feedback clock signal comprises one of the second output clock signal and a second output of the second logic block derived from the second output clock signal.

18. The delay balancing system of claim 15, wherein:
the first domain comprises a first voltage domain; and
the second domain comprises a second voltage domain different than the first voltage domain.

19. The delay balancing system of claim 15, wherein:
the first domain comprises a first electronic device; and
the second domain comprises a second electronic device.

20. The delay balancing system of claim 15, wherein:
the third clock signal is a higher frequency harmonic of the reference clock signal.

* * * * *